United States Patent
Shinohara et al.

(10) Patent No.: US 8,026,118 B2
(45) Date of Patent: Sep. 27, 2011

(54) GALLIUM NITRIDE BASED COMPOUND SEMICONDUCTOR LIGHT-EMITTING DEVICE AND METHOD FOR MANUFACTURING SAME

(75) Inventors: Hironao Shinohara, Ichihara (JP); Hiroshi Osawa, Chiba (JP)

(73) Assignee: Showa Denko K.K., Tokyo (JP)

( * ) Notice: Subject to any disclaimer, the term of this patent is extended or adjusted under 35 U.S.C. 154(b) by 503 days.

(21) Appl. No.: 12/096,827

(22) PCT Filed: Dec. 12, 2006

(86) PCT No.: PCT/JP2006/324733
§ 371 (c)(1),
(2), (4) Date: Jun. 10, 2008

(87) PCT Pub. No.: WO2007/069590
PCT Pub. Date: Jun. 21, 2007

(65) Prior Publication Data
US 2009/0309119 A1    Dec. 17, 2009

(30) Foreign Application Priority Data
Dec. 14, 2005   (JP) ................................ 2005-360290

(51) Int. Cl.
*H01L 21/3065* (2006.01)
(52) U.S. Cl. .................. 438/46; 257/103; 257/E21.218; 438/720
(58) Field of Classification Search .................. 257/103, 257/E33.025, E21.217, E21.218; 438/46, 438/720
See application file for complete search history.

(56) References Cited

U.S. PATENT DOCUMENTS

| | | | | |
|---|---|---|---|---|
| 5,559,057 | A * | 9/1996 | Goldstein | 438/725 |
| 6,521,999 | B1 * | 2/2003 | Uemura et al. | 257/745 |
| 6,844,569 | B1 | 1/2005 | Lee et al. | |
| 7,282,240 | B1 * | 10/2007 | Jackman et al. | 427/282 |
| 2003/0178626 | A1 | 9/2003 | Sugiyama et al. | |

(Continued)

FOREIGN PATENT DOCUMENTS

JP    06-291368 A    10/1994

(Continued)

OTHER PUBLICATIONS

R.H. Horng et al.; "GaN-based light-emitting diodes with indium tin oxide texturing window layers using natural lithography"; Applied Physics Letters; vol. 86; 2005; pp. 221101-1 to 221101-3, No month given.

(Continued)

*Primary Examiner* — Allan R Wilson
(74) *Attorney, Agent, or Firm* — Sughrue Mion, PLLC

(57) ABSTRACT

The present invention provides a gallium nitride based compound semiconductor light-emitting device having high light emission efficiency and a method of manufacturing the same. The gallium nitride based compound semiconductor light-emitting device includes: a substrate 11; an n-type semiconductor layer 13, a light-emitting layer 14, and a p-type semiconductor layer 15 that are composed of gallium nitride based compound semiconductors and formed on the substrate 11 in this order; a transparent positive electrode 16 that is formed on the p-type semiconductor layer 15; a positive electrode bonding pad 17 that is formed on the transparent positive electrode 16; a negative electrode bonding pad 18 that is formed on the n-type semiconductor layer 13; and an uneven surface that has random convex portions formed thereon and is provided on at least a portion of the surface 16a of the transparent positive electrode 16.

4 Claims, 2 Drawing Sheets

U.S. PATENT DOCUMENTS

| | | |
|---|---|---|
| 2004/0206969 A1 | 10/2004 | Orita |
| 2005/0173718 A1 | 8/2005 | Shin |
| 2005/0263779 A1* | 12/2005 | Hon et al. .................. 257/94 |
| 2006/0001046 A1* | 1/2006 | Batres et al. ............... 257/202 |
| 2006/0001056 A1* | 1/2006 | Saxler ......................... 257/257 |
| 2006/0033120 A1* | 2/2006 | Hon et al. .................. 257/103 |
| 2006/0115917 A1* | 6/2006 | Linden ......................... 438/46 |
| 2006/0186424 A1* | 8/2006 | Fujimoto et al. ............. 257/98 |
| 2007/0082418 A1* | 4/2007 | Wuu et al. .................... 438/22 |
| 2009/0278158 A1* | 11/2009 | Fukunaga et al. ........... 257/99 |
| 2010/0230714 A1* | 9/2010 | Shinohara et al. .......... 257/103 |

FOREIGN PATENT DOCUMENTS

| | | |
|---|---|---|
| JP | 06-310428 A | 11/1994 |
| JP | 07-078807 A | 3/1995 |
| JP | 2003-218383 A | 7/2003 |
| JP | 2005-005679 A | 1/2005 |
| JP | 2005-197506 A | 7/2005 |
| JP | 2005-223329 A | 8/2005 |
| KR | 10-2005-0079279 A | 8/2005 |
| TW | 248028 | 10/2004 |

OTHER PUBLICATIONS

Hung-Wen Huang et al; "Improvement of InGaN-GaN Light-Emitting Diode Performance With a Nano-Roughened p-GaN Surface"; IEEE Photonics Technology Letters; vol. 17, No. 5; May 2005; pp. 983-985.

* cited by examiner

GALLIUM NITRIDE BASED COMPOUND SEMICONDUCTOR LIGHT-EMITTING DEVICE AND METHOD FOR MANUFACTURING SAME

TECHNICAL FIELD

The present invention relates to a gallium nitride based compound semiconductor light-emitting device, and more particularly, to a gallium nitride based compound semiconductor light-emitting device having high light emission efficiency and a method of manufacturing the same.

Priority is claimed on Japanese Patent Application No. 2005-360290, filed Dec. 14, 2005, the content of which is incorporated herein by reference.

BACKGROUND ART

In recent years, gallium nitride (GaN) compound semiconductor light-emitting devices have drawn attention as short wavelength light-emitting devices. The gallium nitride based compound semiconductor light-emitting device is formed on various kinds of substrates, such as a sapphire single crystal substrate, an oxide substrate, and a III-V group compound substrate, by a metal organic chemical vapor deposition (MOCVD) method or a molecular beam epitaxy (MBE) method.

The gallium nitride based compound semiconductor light-emitting device is characterized in that a small amount of current is diffused in the horizontal direction. Therefore, a current is applied to only a semiconductor immediately below an electrode, and light emitted from a light-emitting layer immediately below the electrode is shielded by the electrode, which makes it difficult to emit light from the light-emitting device to the outside. In addition, in the light-emitting device, a transparent electrode is generally used as a positive electrode, and light is emitted to the outside through the positive electrode.

In the related art, a transparent positive electrode composed of the transparent electrode has a laminated structure of a Ni or Co oxide layer and an Au contact metal layer. In addition, in recent years, a technique has been proposed which uses as a positive electrode having a laminated structure of a layer formed of a conductive oxide, such as ITO ($In_2O_3$—$SnO_2$), and a contact metal layer having a very small thickness, thereby improving transparency and the emission efficiency of light from a light-emitting layer to the outside.

However, the external quantum efficiency of the light-emitting device is represented by the product of light emission efficiency and internal quantum efficiency. The internal quantum efficiency means the ratio at which the energy of a current applied to the light-emitting device is converted into light. The light emission efficiency means the ratio of light emitted to the outside to light generated from the inside of a semiconductor crystal.

In recent years, the internal quantum efficiency of the light-emitting device has increased up to about 70 to 80% by improving the state or structure of crystal, and high internal quantum efficiency with respect to the amount of current applied has been obtained.

However, in light-emitting diodes (LEDs) as well as the gallium nitride based compound semiconductor light-emitting devices, generally, the light emission efficiency with respect to the amount of current applied is very low. Therefore, it is difficult to emit a sufficient amount of light to the outside with respect to the current applied.

The reason why the light emission efficiency is low in the gallium nitride based compound semiconductor light-emitting device is that, since the light-emitting layer of the gallium nitride based compound semiconductor has a refractive index of about 2.5 that is considerably higher than that of air, which is 1, and a small threshold angle of about 25°, no light is emitted to the outside due to repeated reflection and absorption of light in the crystal.

In order to improve the light emission efficiency, a gallium nitride based compound semiconductor light-emitting device has been proposed in which a rough emission surface is provided to emit light at various angles, thereby improving the light emission efficiency (for example, Patent Document 1, i.e. JP-A-6-291368).

However, in the light-emitting device disclosed in Patent Document 1, since the rough emission surface is formed on a semiconductor material, a large load is applied to the semiconductor layer, and the semiconductor layer is greatly damaged. Therefore, even though the external quantum efficiency (light emission efficiency) is improved, the internal quantum efficiency is lowered. As a result, it is difficult to improve emission intensity.

Further, a method of roughening the semiconductor layer requires minute mask patterning. Therefore, the manufacturing process becomes complicated, which results in low manufacturing efficiency.

Furthermore, since an uneven pattern formed by the mask patterning method causes interference, constructive interference occurs at a specific wavelength.

The invention has been made in order to solve the above problems, and an object of the invention is to provide a gallium nitride based compound semiconductor light-emitting device having high light emission efficiency and a small variation in wavelength and a method of manufacturing the same.

DISCLOSURE OF INVENTION

The inventors have conceived the invention in order to solve the above problems.

That is, the invention is as follows.

According to a first aspect of the invention, a gallium nitride based compound semiconductor light-emitting device includes: a substrate; an n-type semiconductor layer, a light-emitting layer, and a p-type semiconductor layer that are composed of gallium nitride based compound semiconductors and formed on the substrate in this order; a transparent positive electrode that is formed on the p-type semiconductor layer; a positive electrode bonding pad that is formed on the transparent positive electrode; a negative electrode bonding pad that is formed on the n-type semiconductor layer; and an uneven surface that has random convex portions formed thereon and is provided on at least a portion of the surface of the transparent positive electrode.

According to a second aspect of the invention, in the gallium nitride based compound semiconductor light-emitting device according to the first aspect, preferably, the average distance between the centers of the convex portions on the uneven surface that is formed on the surface of the transparent positive electrode is in the range of 0.01 µm to 3 µm.

According to a third aspect of the invention, in the gallium nitride based compound semiconductor light-emitting device according to the first aspect, preferably, the average distance between the centers of the convex portions on the uneven surface that is formed on the surface of the transparent positive electrode is in the range of 0.05 µm to 1.5 µm.

According to a fourth aspect of the invention, in the gallium nitride based compound semiconductor light-emitting device according to the second or third aspect, preferably, the standard deviation of the distances between the convex portions with respect to the average distance between the convex portions is in the range of 10% to 80%.

According to a fifth aspect of the invention, in the gallium nitride based compound semiconductor light-emitting device according to any one of the first to fourth aspects, preferably, the transparent positive electrode is formed of a conductive oxide.

According to a sixth aspect of the invention, in the gallium nitride based compound semiconductor light-emitting device according to any one of the first to fifth aspects, preferably, the transparent positive electrode is formed of at least one of $ITO(In_2O_3—SnO_2)$, $AZO(ZnO—Al_2O_3)$, $IZO(In_2O_3—ZnO)$, and $GZO(ZnO—GeO_2)$.

According to a seventh aspect of the invention, a method of manufacturing a gallium nitride based compound semiconductor light-emitting device is provided. The method includes: (1) a process of sequentially forming on a substrate an n-type semiconductor layer, a light-emitting layer, a p-type semiconductor layer, and a transparent positive electrode, the n-type semiconductor layer, the light-emitting layer, and the p-type semiconductor layer each composed of a gallium nitride based compound semiconductor; (2) a process of forming a mask made of metal particles on the surface of the transparent positive electrode; and (3) a process of performing dry etching on the transparent positive electrode using the mask.

According to an eighth aspect of the invention, in the method of manufacturing a gallium nitride based compound semiconductor light-emitting device according to the seventh aspect, preferably, the process (2) includes: forming a metal thin film on the surface of the transparent positive electrode; and performing a heat treatment.

According to a ninth aspect of the invention, in the method of manufacturing a gallium nitride based compound semiconductor light-emitting device according to the seventh or eighth aspect, preferably, the metal particles of the mask are made of Ni, or a Ni alloy.

According to a tenth aspect of the invention, in the method of manufacturing a gallium nitride based compound semiconductor light-emitting device according to any one of the seventh to ninth aspects, preferably, the metal particles of the mask are made of a metal with a low melting point or an alloy with low melting point having a melting point in the range of 100° C. to 450° C.

According to an eleventh aspect of the invention, in the method of manufacturing a gallium nitride based compound semiconductor light-emitting device according to any one of the seventh to tenth aspects, preferably, the metal particles of the mask are made of a metal with a low melting point selected from Ni, Au, Sn, Ge, Pb, Sb, Bi, Cd, and In, or an alloy with a low melting point including at least one of the metallic materials.

According to a twelfth aspect of the invention, in the method of manufacturing a gallium nitride based compound semiconductor light-emitting device according to any one of the seventh to eleventh aspects, preferably, the uneven surface is formed on at least a portion of the surface of the transparent positive electrode by wet etching.

According to a thirteenth aspect of the invention, a lamp is provided including the gallium nitride based compound semiconductor light-emitting device according to any one of the first to sixth aspects.

According to a fourteenth aspect of the invention, a lamp is provided including the gallium nitride based compound semiconductor light-emitting device manufactured by the method according to any one of the sixth to twelfth aspects.

According to the gallium nitride based compound semiconductor light-emitting device of the above-mentioned aspects, a random uneven surface is formed on at least a portion of the surface of the transparent positive electrode. Therefore, it is possible to obtain a gallium nitride based compound semiconductor light-emitting device having a high light emission efficiency and a small variation in wavelength.

Further, when the gallium nitride based compound semiconductor light-emitting device according to the above-mentioned aspects is used to manufacture a lamp, it is possible to increase the light correcting ability according to the characteristics of a resin used for the lamp. As a result, it is possible to achieve a lamp with high emission power.

In the gallium nitride based compound semiconductor light-emitting device according to the above-mentioned aspect, a process of forming the uneven surface has the following effects (1) to (3):

(1) it is possible to manufacture a gallium nitride based compound semiconductor light-emitting device capable of preventing interference and having a small variation in wavelength by forming an uneven surface having a certain variation range;

(2) a complicated patterning process is not needed since a metal particle mask is used to form the uneven surface, and thus it is possible to simply form a fine rough surface at a low cost; and (3) since the uneven surface is formed on the surface of the transparent positive electrode, it is possible to form a light-emitting device without damaging the semiconductor layer.

BEST MODE FOR CARRYING OUT THE INVENTION

Hereinafter, a gallium nitride based compound semiconductor light-emitting device according to an embodiment of the invention will be described with reference to FIGS. 1 to 3.
[Overall Structure of Gallium Nitride Based Compound Semiconductor Light-Emitting Device]

Figure 1:
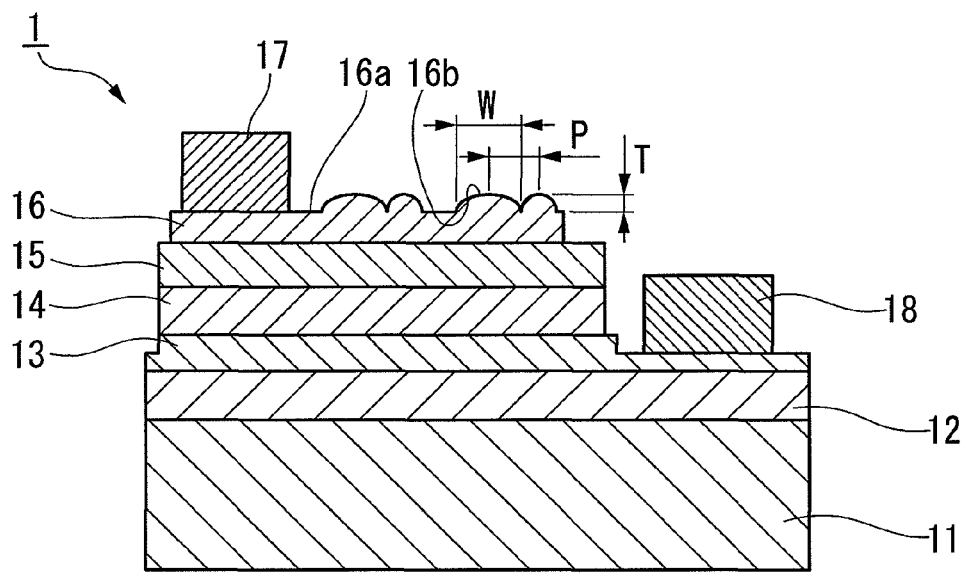
FIG. 1 is a cross-sectional view schematically illustrating the structure of a gallium nitride based compound semiconductor light-emitting device according to an embodiment of the invention.

As shown in FIG. 1, a gallium nitride based compound semiconductor light-emitting device 1 according to this embodiment has a schematic structure in which an n-type semiconductor layer 13, a light-emitting layer 14, and a p-type semiconductor layer 15, each composed of a gallium nitride based compound semiconductor, are laminated on a substrate 11 in this order, a transparent positive electrode 16 is formed on the p-type semiconductor layer 15, a positive electrode bonding pad 17 is formed on the transparent positive electrode 16, a negative electrode bonding pad 18 is formed on the n-type semiconductor layer 13, and an uneven surface having random convex and concave portions is formed on at least a portion of a surface 16a of the transparent positive electrode 16. In addition, as shown in FIG. 1, a buffer layer 12 is provided between the substrate 11 and the n-type semiconductor layer 13.

In the gallium nitride based compound semiconductor light-emitting device according to this embodiment, convex and concave portions having specific shapes are formed on the surface 16a of the transparent positive electrode 16, which is an emission surface, thereby improving light emission efficiency.

The substrate 11 may be formed of any known substrate materials including oxide single crystal, such as sapphire single crystal ($Al_2O_3$; an A-plane, a C-plane, an M-plane, or an R-plane), spinel single crystal ($MgAl_2O_4$), ZnO single crystal, $LiAlO_2$ single crystal, $LiGaO_2$ single crystal, or MgO single crystal, Si single crystal, SiC single crystal, GaAs single crystal, AlN single crystal, GaN single crystal, and boride single crystal, such as $ZrB_2$. It is preferable that the substrate 11 be formed of sapphire single crystal or SiC single crystal among these materials.

In addition, the plane direction of the substrate is not particularly limited. As the substrate, a just substrate or an off-angle substrate may be used.

In general, the n-type semiconductor layer 13, the light-emitting layer 14, and the p-type semiconductor layer 15, each composed of a gallium nitride based compound semiconductor, are formed on the substrate 11 with the buffer layer 12 interposed therebetween. The buffer layer 12 may not be provided according to the growth conditions of the substrate 11 or an epitaxial layer.

Various kinds of gallium nitride based compound semiconductors have been known which are represented by a general formula $Al_XGa_YIn_ZN_{1-A}M_A$ ($0 \leq x < 1$, $0 \leq Y \leq 1$, $0 \leq Z \leq 1$ and $X+Y+Z=1$. $M_A$ indicates a V-group element different from nitrogen (N) and $0 \leq A < 1$). The invention can also use any kind of gallium nitride based compound semiconductor represented by the general formula $Al_XGa_YIn_ZN_{1-A}M_A$ ($0 \leq X < 1$, $0 \leq Y \leq 1$, $0 \leq Z \leq 1$ and $X+Y+Z=1$. $M_A$ indicates a V-group element different from nitrogen N and $0 \leq A < 1$) in addition to the known gallium nitride based compound semiconductors.

The gallium nitride based compound semiconductor may include III-group elements other than Al, Ga, and In, and it may include elements, such as Ge, Si, Mg, Ca, Zn, Be, P, As, and B, if necessary. In addition, it may include dopants, a raw material, and a very small amount of dopant contained in a reaction coil material that are necessarily contained depending on deposition conditions, in addition to the elements that are intentionally added.

A method of growing the gallium nitride based compound semiconductor is not particularly limited. For example, any method of growing a nitride compound semiconductor, such as an MOCVD (metal organic chemical vapor deposition) method, an HVPE (hydride vapor phase epitaxy) method, or an MBE (molecular beam epitaxy) method, may be used to grow the gallium nitride based compound semiconductor. The MOCVD method is preferable in terms of the control of the thickness of a film and mass production. In the MOCVD method, hydrogen ($H_2$) or nitrogen ($N_2$) is used as a carrier gas, trimethylgallium (TMG) or triethylgallium (TEG) is used as a Ga source, which is a group-III element, trimethylaluminum (TMA) or triethylaluminum (TEA) is used as an Al source, trimethylindium (TMI) or triethylindium (TEI) is used as an In source, and ammonium ($NH_3$) or hydrazine ($N_2H_4$) is used as a nitrogen (N) source, which is a group-V element. In addition, for example, Si-based materials, such as monosilane ($SiH_4$) and disilane ($Si_2H_6$), and Ge-based materials, that is, organic germanium compounds, such as germane ($GeH_4$), tetramethylgermanium (($CH_3)_4Ge$), and tetraethylgermanium (($C_2H_5)_4Ge$), are uses as n-type dopants. In the MBE method, elemental germanium may be used as a dopant source. Mg-based materials, such as bis-cyclopentadienylmagnesium ($Cp_2Mg$) and bisethylcyclopentadienyl magnesium (($EtCp)_2Mg$), are used as p-type dopants.

In general, the n-type semiconductor layer 13 includes an underlying layer, an n contact layer, and an n clad layer. The n contact layer may also serve as the underlying layer and/or the n clad layer.

It is preferable that the underlying layer be composed of an $Al_XGa_{1-X}N$ layer ($0 \leq X \leq 1$, preferably, $0 \leq X \leq 0.5$, more preferably, $0 \leq X \leq 0.1$). The thickness of the underlying layer is preferably greater than or equal to 0.1 µm, more preferably, greater than or equal to 0.5 µm, most preferably, greater than or equal to 1 µm. This thickness range makes it possible to obtain an $Al_XGa_{1-X}N$ layer having high crystallinity.

The underlying layer may be doped with n-type dopants in the range of $1 \times 10^{17}$ to $1 \times 10^{19}/cm^3$. However, it is more preferable that the underlying layer be undoped ($<1 \times 10^{17}/cm^3$) in order to maintain high crystallinity. For example, the n-type dopants may be Si, Ge, and Sn, preferably, Si and Ge, but are not limited thereto.

The underlying layer is preferably grown at a temperature of 800 to 1200° C., more preferably, 1000 to 1200° C. The temperature range makes it possible to obtain an underlying layer having high crystallinity. In addition, the internal pressure of an MOCVD growth furnace is preferably in the range of 15 to 40 kPa.

Similar to the underlying layer, it is preferable that the n contact layer be composed of an $Al_XGa_{1-X}N$ layer ($0 \leq x \leq 1$, preferably, $0 \leq x \leq 0.5$, more preferably, $0 < x \leq 0.1$). In addition, the n contact layer is preferably doped with n-type dopants. When the n-type dopants are contained at a concentration of $1 \times 10^{17}$ to $1 \times 10^{19}/cm^3$, preferably, $1 \times 10^{18}$ to $1 \times 10^{19}/cm^3$, it is possible to maintain low ohmic contact resistance with the negative electrode, prevent the occurrence of cracks, and maintain high crystallinity. For example, the n-type dopants may be Si, Ge, and Sn, preferably, Si and Ge, but are not limited thereto. The growth temperature of the n contact layer is equal to that of the underlying layer.

It is preferable that the gallium nitride based compound semiconductors forming the underlying layer and the n contact layer have the same composition. The sum of the thicknesses of the semiconductor layers is preferably in the range of 1 to 20 µm, more preferably, 2 to 15 µm, most preferably, 3 to 12 µm. This thickness range makes it possible to maintain high crystallinity of the semiconductor.

It is preferable that an n clad layer be provided between the n contact layer and the light-emitting layer. The n clad layer can improve the flatness of the outermost surface of the n contact layer. The n clad layer may be formed of, for example, AlGaN, GaN, or GaInN. In addition, the n clad layer may have a heterojunction structure of the semiconductor layers or a superlattice structure of a plurality of laminates of the semiconductor layers. When the n clad layer is formed of GaInN, it is preferable that the band gap thereof be larger than that of GaInN forming the light-emitting layer.

The thickness of the n clad layer is not particularly limited, but is preferably in the range of 5 to 500 nm (0.005 to 0.5 μm), more preferably, 5 to 100 nm (0.005 to 0.1 μm).

In addition, the n-type dopant concentration of the n clad layer is preferably in the range of $1\times10^{17}$ to $1\times10^{20}$/cm$^3$, preferably, $1\times10^{18}$ to $1\times10^{19}$/cm$^3$. This dopant concentration range makes it possible to maintain high crystallinity and reduce the driving voltage of a light-emitting device.

The light-emitting layer 14 is formed on the n-type semiconductor layer 13. In general, the light-emitting layer is composed of a gallium nitride based compound semiconductor, preferably, a gallium nitride based compound semiconductor made of $Ga_{1-s}In_sN$ (0<s<0.4).

The thickness of the light-emitting layer 14 is not particularly limited. However, it is preferable that the light-emitting layer 14 has a sufficient thickness to obtain a quantum effect, that is, a threshold thickness. For example, the thickness of the light-emitting layer 14 is preferably in the range of 1 to 10 nm, more preferably, 2 to 6 nm. This thickness range makes it possible to improve emission power.

The light-emitting layer may have a multiple quantum well (MQW) structure of a $Ga_{1-s}In_sN$ well layer and an $Al_cGa_{1-c}N$ (0≦c<0.3 and b>c) barrier layer having higher band gap energy than the well layer, in addition to the single quantum well (SQW) structure. In addition, the well layer and the barrier layer may be doped with dopants.

The growth temperature of the $Al_cGa_{1-c}N$ barrier layer is preferably greater than or equal to 700° C. The growth temperature of the $Al_cGa_{1-c}N$ barrier layer is preferably in the range of 800 to 1100° C. in order to obtain high crystallinity. The growth temperature of the GaInN well layer is preferably in the range of 600 to 900° C., more preferably, 700 to 900° C. That is, it is preferable to change the temperature between the layers in order to obtain high crystallinity in the MQW.

In general, the p-type semiconductor layer 15 includes a p clad layer and a p contact layer. However, the p contact layer may also serve as the p clad layer.

The p clad layer is not particularly limited as long as it has a composition that has band gap energy higher than that of the light-emitting layer and it can confine carriers in the light-emitting layer. It is preferable that the p clad layer be formed of $Al_dGa_{1-d}N$ (0<d≦0.4, preferably, 0.1≦d≦0.3). When the p clad layer is formed of AlGaN, it is possible to confine carriers in the light-emitting layer. The thickness of the p clad layer is not particularly limited, but is preferably in the range of 1 to 400 nm, more preferably, 5 to 100 nm. The p-type dopant concentration of the p clad layer is preferably in the range of $1\times10^{18}$ to $1\times10^{21}$/cm$^3$, preferably, $1\times10^{19}$ to $1\times10^{20}$/cm$^3$. This p-type dopant concentration range makes it possible to obtain good p-type crystal without deteriorating crystallinity.

The p contact layer is composed of a gallium nitride based compound semiconductor layer containing at least $Al_eGa_{1-e}N$ (0≦e<0.5, preferably, 0≦e≦0.2, more preferably, 0≦e≦0.1). When the Al composition is within the above range, it is possible to maintain high crystallinity and low ohmic contact resistance with a p ohmic electrode.

When the p-type dopant concentration is in the range of $1\times10^{18}$ to $1\times10^{21}$/cm$^3$, it is possible to maintain a low ohmic contact resistance, prevent the occurrence of cracks, and maintain high crystallinity. It is more preferable that the p-type dopant concentration be in the range of $5\times10^{19}$ to $5\times10^{20}$/cm$^3$.

For example, the p-type dopant may be Mg, but is not limited thereto.

The thickness of the p contact layer is not particularly limited, but is preferably in the range of 10 to 500 nm (0.01 to 0.5 μm), more preferably, 50 to 200 nm (0.05 to 0.2 μm). This thickness range makes it possible to improve emission power.

The transparent positive electrode 16 may be formed of at least one of ITO($In_2O_3$—$SnO_2$), AZnO(ZnO—$Al_2O_3$), IZnO ($In_2O_3$—ZnO), and GZO(ZnO—$Ga_2O_3$) by a means that has been known in this technical field. The transparent positive electrode may have any known structure.

The transparent positive electrode 16 may be formed so as to cover substantially the entire surface of the p-type semiconductor layer 15, or it may be formed in a lattice shape or a tree shape. After the transparent positive electrode 16 is formed, a thermal annealing process may be formed for alloying or transparency, or it may not be formed.

An uneven pattern, that is, an uneven surface is formed on at least a portion of the surface 16a of the transparent positive electrode 16. In the example shown in FIG. 1, a convex pattern composed of a plurality of random convex portions 16b is formed on the surface 16a of the transparent positive electrode 16 substantially at the center of the gallium nitride based compound semiconductor light-emitting device 1 in the horizontal direction.

As a method of forming the uneven pattern on the surface 16a of the transparent positive electrode 16, a known photolithography method may be used.

In this embodiment, the random uneven pattern is formed on the surface 16a, as shown in FIG. 1, but the invention is not limited thereto. For example, a pattern in which the convex portions have different sizes or a pattern in which the convex portions are arranged at irregular intervals may be used.

The shape of the convex portion 16b is not particularly limited. For example, the convex portion 16b may be formed in various shapes including a cylinder, a polygonal prism, such as a triangular prism or a square pillar, a cone, or a polygonal pyramid, such as a triangular pyramid or a quadrangular pyramid. In addition, in the cross-sectional view shown in FIG. 1, it is preferable that the dimension W (width) of the bottom of the convex portion 16b be greater than or equal to that of the top thereof. In FIG. 1, the convex portion 16b is configured to be tapered from the bottom to the top.

The size of the convex portion 16b is not particularly limited. For example, preferably, the width W of the bottom is in the range of 0.01 μm to 3 μm. This range of the width W of the bottom makes it possible to effectively improve light emission efficiency.

A lithography technique can be used to form the convex portion 16b such that the width W of the bottom of the convex portion 16b is smaller than 0.01 μm. However, in this case, this process costs a great deal and the size of the convex portion is too small to obtain sufficiently high emission efficiency.

In general, the size of the gallium nitride based compound semiconductor light-emitting device is in the range of 100 μm to 2000 μm. Therefore, when the width W of the bottom of the convex portion 16b is larger than 3 μm, the surface area of the convex portion 16b in a unit area decreases, which makes it difficult to obtain sufficiently high emission efficiency. It is more preferable that the width W of the bottom of the convex portion 16b be in the range of 0.02 μm to 2 μm.

The distance P between the centers of the convex portions 16b is not particularly limited, but the average distance is preferably in the range of 0.01 μm to 3 μm, more preferably, 0.05 μm to 1.5 μm. This range of the distance range P between the centers of the convex portions 16b makes it possible to effectively improve the light emission efficiency.

A lithography technique can be used to form the convex portions 16b such that the average of the distance P between the centers of the convex portions 16b is smaller than 0.01 μm.

However, in this case, this process costs a great deal, and a pattern is too dense. As a result, there is a concern that light emission efficiency will be lowered.

Further, as described above, the size of the light-emitting device is generally in the range of 100 μm to 2000 μm. When the distance between the convex portions 16b is larger than 3 μm, the surface area of the convex portion 16b in a unit area decreases, and it is difficult to obtain sufficiently high light emission efficiency. Therefore, it is more preferable that the distance between the concave portions be in the range of 0.02 μm to 2 μm.

The standard deviation of the average distance between the convex portions 16b is preferably in the range of 10% to 80%, more preferably, 20% to 60%.

When the standard deviation is less than or equal to 10%, interference increases, and a wavelength variation is more likely to occur. On the other hand, when the standard deviation is higher than 80%, the density of the uneven pattern is reduced, and the light emission efficiency is lowered.

It is preferable that the average of the heights T of the convex portions 16b be in the range of 0.1 μm to 2.0 μm.

It is more preferable that the convex portion 16b be formed such that the relationship between the width W of the bottom and the height T satisfies W<T. When the above-mentioned relationship is satisfied, it is possible to more effectively improve the light emission efficiency of the gallium nitride based compound semiconductor light-emitting device.

The positive electrode bonding pad 17 is provided on the transparent positive electrode 16. In the example shown in FIG. 1, the positive electrode bonding pad is provided on a portion of the transparent positive electrode 16 other than the uneven surface.

The positive electrode bonding pad 17 may be formed of various materials using Au, Al, Ni, and Cu. However, the material and the structure of the positive electrode bonding pad are not particularly limited.

It is preferable that the thickness of the positive electrode bonding pad 17 be in the range of 100 to 1000 nm. In addition, the bonding pad has characteristics that, as the thickness thereof increases, bondability is improved. Therefore, it is preferable that that thickness of the positive electrode bonding pad 17 be greater than or equal to 300 nm. In addition, it is preferable that the thickness of the positive electrode bonding pad be less than or equal to 500 nm in order to reduce manufacturing costs.

The negative electrode bonding pad 18 is formed so as to come into contact with the n-type semiconductor layer 13 of the gallium nitride based compound semiconductor, which is a laminate of the n-type semiconductor layer 13, the light-emitting layer 14, and the p-type semiconductor layer 15 sequentially formed on the substrate 11.

Therefore, when the negative electrode bonding pad 18 is formed, the light-emitting layer 14 and the p-type semiconductor layer 15 are partially removed to expose the n contact layer of the n-type semiconductor layer 13, and the negative electrode bonding pad 18 is formed on the exposed portion.

The negative electrode bonding pad 18 may be formed of any material whose composition and structure have been known, and the negative electrode bonding pad can be formed by a means that has been known in this technical field.

Figure 3:
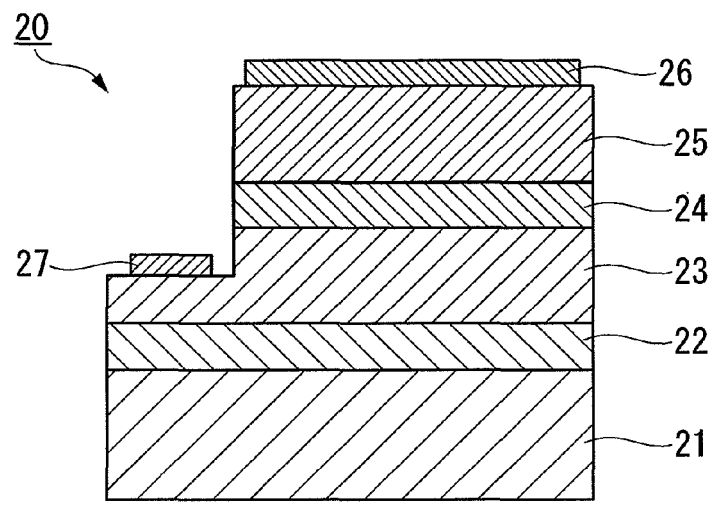
FIG. 3 is a cross-sectional view schematically illustrating a laminated structure of gallium nitride based compound semiconductors in the gallium nitride based compound semiconductor light-emitting device according to the embodiment of the invention.

As an example of the gallium nitride based compound semiconductor in which a region having a random uneven pattern provided therein is formed on the transparent positive electrode, a gallium nitride based compound semiconductor 20 shown in FIG. 3, which is a laminated structure of a buffer layer 22, an n-type semiconductor layer 23, a light-emitting layer 24, a p-type semiconductor layer 25, and a transparent positive electrode 26 sequentially crystal-grown on a substrate 21, has been known.

In this embodiment, the above-mentioned random uneven pattern may be formed on the surface of a transparent positive electrode of a semiconductor light-emitting device such as the gallium nitride based compound semiconductor 20.

[Method of Manufacturing Gallium Nitride Based Compound Semiconductor Light-Emitting Device]

A method of manufacturing the gallium nitride based compound semiconductor light-emitting device according to this embodiment includes the following processes (1) to (3):

(1) a process of sequentially laminating on a substrate an n-type semiconductor layer, a light-emitting layer, a p-type semiconductor layer, each of which is composed of a gallium nitride based compound semiconductor, and a transparent positive electrode;

(2) a process of forming a mask made of metal particles on the surface of the transparent positive electrode; and (3) a process of performing dry etching on the transparent positive electrode using the mask.

In this embodiment, an uneven surface can be formed on the transparent positive electrode by forming a mask made of metal particles on a region of the transparent positive electrode in which the uneven surface is formed and performing dry etching on the transparent positive electrode using the mask.

Next, the processes (1) to (3) will be described.

<Process (1)>

First, an n-type semiconductor layer, a light-emitting layer, a p-type semiconductor layer, each of which is composed of a gallium nitride based compound semiconductor, and a transparent positive electrode are laminated on a substrate in this order. As described above, any of the materials and the growth methods according to the related art may be used to form the laminated structure of the gallium nitride based compound semiconductors.

<Process (2)>

Then, a metal thin film made of metal particles is formed on the transparent positive electrode. The metal thin film may be formed by a general vapor deposition apparatus.

In this embodiment, since the shape of the uneven pattern formed on the transparent positive electrode is defined by the shape of the metal particle mask, it is possible to control the shape of the uneven pattern by controlling the shape of the metal particle mask. In particular, the shape of the uneven pattern on the surface of the transparent positive electrode is greatly affected by the thickness of the metal particle mask.

It is preferable that the thickness of the metal particle mask before a heat treatment be in the range of 0.005 μm to 1 μm. The optimum value of the thickness of the metal particle mask depends on the quality of a material forming the metal particle mask or the quality of a sealing resin used when the gallium nitride based compound semiconductor light-emitting device according to this embodiment forms a lamp. However, when the thickness of the metal particle mask is smaller than 0.005 μm, the metal particle mask cannot serve as a mask, and it is difficult to form an uneven pattern capable of effectively emitting light on the transparent positive electrode. On the other hand, when the thickness of the metal particle mask is larger than 1 μm, a cohesion effect is deteriorated, and it is difficult to form the uneven pattern capable of effectively emitting light on the surface of the transparent positive electrode, as described above.

The metal thin film may be formed by, for example, a sputtering apparatus, instead of the vapor deposition apparatus, as long as the metal thin film can be formed with a uniform thickness within the above-mentioned range.

The metal particles used for the metal thin film (metal particle mask) may be composed of fine particles having spherical shapes and high cohesion. For example, Ni particles or Ni alloy particles may be used as the metal particles. In addition, metal particle materials having high cohesion and capable of improving process efficiency may be a metallic materials with a low melting point or alloys with a low melting point that contain at least one of Ni, Au, Sn, Ge, Pb, Sb, Bi, Cd, and In and have a melting point in the range of 100° C. to 450° C. It is preferable to use an AuSn alloy, an AuGe alloy, an AuSnNi alloy, and an AuGeNi alloy among these metallic materials, and it is more preferable to use the AuSn alloy.

It has been found that the AuSn alloy is eutectic at a temperature of about 190 to 420° C. when a Sn composition ratio is in the range of about 10 to 35% by mass. In addition, it has been found that the alloy layer is generally in a cohesive state beyond the temperature range.

Next, a heat treatment is performed on the metal thin film in order to obtain the metal particle mask from the metal thin film.

The heat treatment temperature of the metal thin film depends on the kind of metallic material used. It is preferable that the heat treatment be performed at a temperature in the range of 100 to 600° C. for one minute. When the heat treatment is performed on the metal thin film under these conditions, it is possible to obtain the metal particle mask formed on the transparent positive electrode.

The shape of the metal particle mask after the heat treatment is changed by the concentration of oxygen in the heat treatment atmosphere.

Therefore, it is possible to form a metal particle mask having a shape suitable for improving light emission efficiency by controlling the concentration of oxygen in the heat treatment atmosphere in correspondence with the kind of metallic material used. In addition, it is more preferable to perform the heat treatment in an atmosphere containing no oxygen according to the kind of metallic material, in order to form a good mask shape.

It is preferable that the density of fine particles in the metal particle mask be in the range of $1\times10^5$ particles/mm$^2$ to $1\times10^8$ particles/mm$^2$. This density range makes it possible to effectively improve light emission efficiency. It is more preferable that the density be in the range of $1\times10^6$ particles/mm$^2$ to $1\times10^7$ particles/mm$^2$.

<Process (3)>

Next, dry etching is performed on the transparent positive electrode of the gallium nitride based compound semiconductor using the metal particle mask to form an uneven pattern having a specific shape on the surface of the transparent positive electrode.

As the dry etching, general reactive ion etching (RIE) may be used. In addition, the kind of gas used for dry etching is not particularly limited. However, it is preferable to perform etching using gas including chlorine.

In order to prevent a change in metallic cohesion shape (metal particle shape), it is preferable that the temperature of the substrate be maintained at a temperature of 100° C. or less.

Further, wet etching may be used to form an uneven pattern on the transparent positive electrode. In this case, the metal thin film may be formed or not. A solution containing at least one of hydrochloric acid, nitric acid, iron chloride, oxalic acid, fluoric acid, phosphoric acid, and sulfuric acid is used as an etchant.

A transparent cover is provided to the gallium nitride based compound semiconductor light-emitting device according to this embodiment to form a lamp by, for example, a known means. In addition, it is possible to form a white lamp by combining the gallium nitride based compound semiconductor light-emitting device according to this embodiment with a cover including a phosphor.

Figure 4:
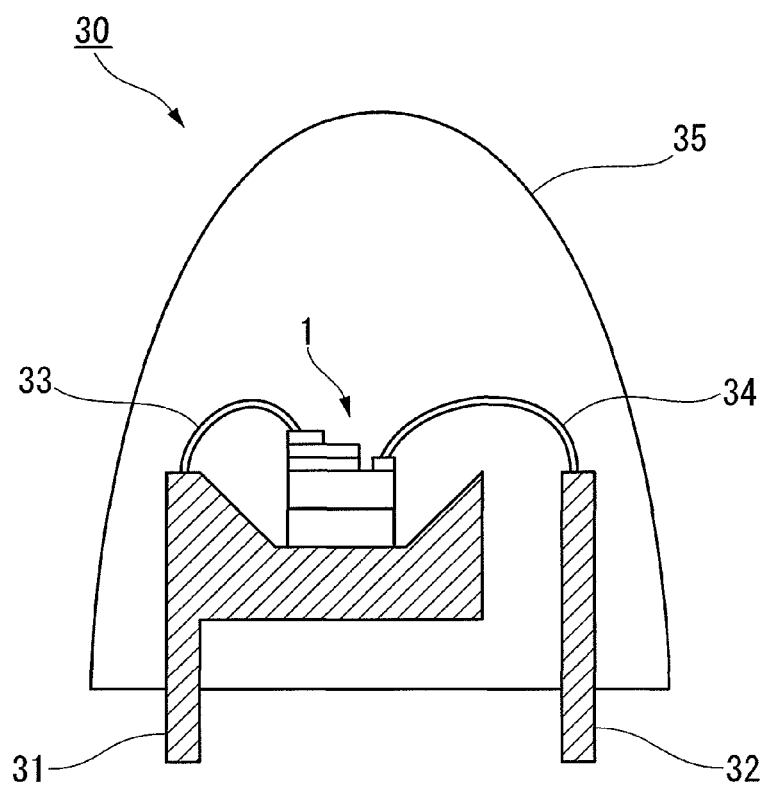
FIG. 4 is a diagram schematically illustrating a lamp including the gallium nitride based compound semiconductor light-emitting device according to the embodiment of the invention.

For example, as shown in FIG. 4, the gallium nitride based compound semiconductor light-emitting device according to this embodiment may be used to form an LED lamp by any known method. The gallium nitride based compound semiconductor light-emitting device may be used for various types of lamps, such as a general-purpose bomb-shaped lamp, a side view type lamp for a backlight of a mobile phone, or a top view type lamp used for a display device. For example, when a face-up gallium nitride based compound semiconductor light-emitting device is mounted to the bomb-shaped lamp, as shown in FIG. 4, the gallium nitride based compound semiconductor light-emitting device 1 is adhered to one of two frames 31 and 32 by, for example, resin, and the positive electrode bonding pad and the negative electrode bonding pad are bonded to the frames 31 and 32 by wires 33 and 34 formed of, for example, gold, respectively. Then, the periphery of the device is molded by a transparent resin (see a mold 35 in FIG. 4), thereby manufacturing a bomb-shaped lamp 30.

The gallium nitride based compound semiconductor light-emitting device according to this embodiment has a low driving voltage Vf and high light emission efficiency. Therefore, it is possible to achieve a high-efficiency lamp.

EXAMPLES

Next, the invention will be described in more detail with reference to Examples, but the invention is not limited thereto.

Experimental Example 1

Figure 2:
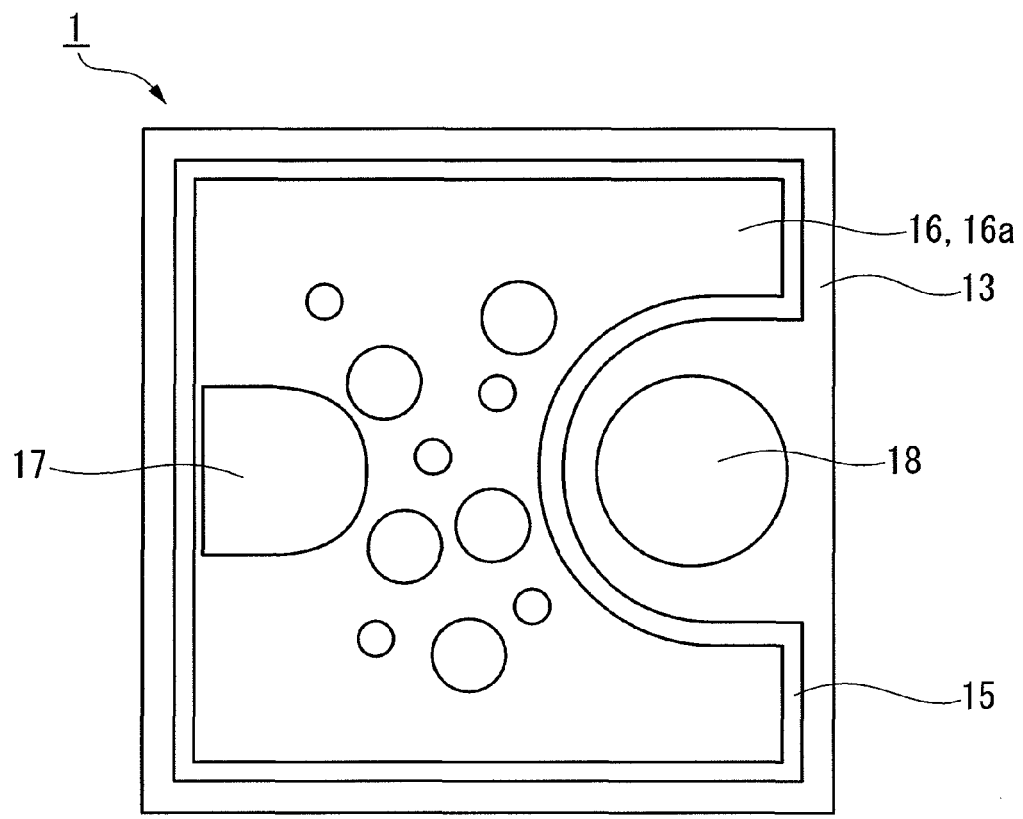
FIG. 2 is a plan view schematically illustrating the structure of the gallium nitride based compound semiconductor light-emitting device according to the embodiment of the invention.

FIG. 1 is a cross-sectional view schematically illustrating a gallium nitride based compound semiconductor light-emitting device according to Experimental example 1, and FIG. 2 is a plan view schematically illustrating the gallium nitride based compound semiconductor light-emitting device.

(Manufacture of Gallium Nitride Based Compound Semiconductor Light-Emitting Device)

A gallium nitride based compound semiconductor layer was formed on a sapphire substrate 1 with a buffer layer 12 made of AlN interposed therebetween. The gallium nitride based compound semiconductor layer was formed by laminating an N-type semiconductor layer 13, a light-emitting layer 14 having a multiple quantum well structure, and a p-type semiconductor layer 15 in this order. The N-type semiconductor layer 13 was formed by laminating an undoped GaN underlying layer with a thickness of 8 µm, a Ge-doped n-type GaN contact layer with a thickness of 2 µm, and an n-type In$_{0.1}$Ga$_{0.9}$N clad layer with a thickness of 20 nm (0.02 µm) in this order. The light-emitting layer 14 having a multiple quantum structure was formed by providing a barrier layer on five laminates of a Si-doped GaN barrier layer with a thickness of 16 nm and an In$_{0.06}$Ga$_{0.94}$N well layer with a thickness of 2.5 nm. The p-type semiconductor layer 15 was formed by laminating a Mg-doped p-type Al$_{0.07}$Ga$_{0.93}$N clad layer with a thickness of 10 nm (0.01 µm) and a Mg-doped p-type Al$_{0.02}$Ga$_{0.93}$N contact layer with a thickness of 180 nm (0.18 µm). The semiconductor was configured such that light was emitted from the surface of the semiconductor layer.

In this structure, the carrier concentration of the n-type GaN contact layer is $1\times10^{19}$ cm$^{-3}$, and the doping amount of Si in the GaN barrier layer is $1\times10^{17}$ cm$^-$ The carrier concentration of the p-type AlGaN contact layer is $5\times10^{18}$ cm$^{-3}$, and the doping amount of Mg in the AlGaN contact layer is $5\times10^{19}$ cm$^{-3}$.

The laminated structure of the gallium nitride based compound semiconductor layer (reference numerals 12, 13, 14, and 15 in FIG. 1) was formed by an MOCVD method under the known conditions.

Then, the n-type GaN contact layer in a region for forming the negative electrode was exposed from the gallium nitride based compound semiconductor layer by a reactive ion etching method. In this case, first, a resist was uniformly applied on the entire surface of the p-type semiconductor layer, and the resist was removed from the region for forming the negative electrode by a known lithography technique. Then, the laminated structure was put into a vapor deposition apparatus, and Ni and Ti were deposited at a pressure of $4\times10^{-4}$ Pa or less by an electron beam method to form films with thicknesses of 50 nm and 300 nm, respectively. Thereafter, the resist and a metal film other than the region for forming the negative electrode were removed by a lift-off technique.

Then, a semiconductor substrate was mounted on the electrode in an etching chamber of the reactive ion etching apparatus, and the semiconductor layer was etched until the n-type GaN contact layer was exposed while reducing the pressure of the etching chamber to $10^{-4}$ Pa and supplying Cl$_2$, serving as an etching gas. After the etching process, the semiconductor layer was taken out from the reactive ion etching, and the etching mask was removed by a nitric acid and a fluoric acid.

Then, a Ni contact metal layer with a thickness of 1 nm and a current spreading layer (transparent positive electrode 16), which is an ITO layer with a thickness of 1 μm, were laminated in only a region for forming the positive electrode on the p-type AlGaN contact layer (p-type semiconductor layer 15) by a known photolithography technique and a known lift-off technique. The current spreading layer was formed by putting the substrate having the gallium nitride based compound semiconductor layer formed thereon into a vacuum sputtering apparatus and depositing ITO with a thickness of 1 μm on the p-type AlGaN contact layer.

Then, the substrate having the gallium nitride based compound semiconductor layer formed thereon was taken out from the vacuum chamber, and a heat treatment was performed for transparency.

(Formation of Uneven Pattern)

Next, an uneven pattern composed of a plurality of random convex portions was formed on the surface of the ITO layer (transparent positive electrode 16) in order to improve light emission efficiency.

In order to form the uneven pattern, a known photolithography technique was used to form a resist film on portions other than the ITO layer. Then, the laminate was put into a vapor deposition apparatus and Au/Sn was deposited with a thickness of 15 nm.

Then, a heat treatment was performed at a temperature of 250° C. in an atmosphere including no oxygen to aggregate particles of the Au/Sn thin film, thereby forming a mask made of metal particles. The diameter of the metal particle was in the range of 0.2 to 1.5 μm, and a metal particle layer having a high density of $2\times10^6$ particles/mm$^2$ was formed.

Then, a patterning process using the resist film was performed such that the surface of the positive electrode (ITO film) was exposed, and general dry etching was performed thereon. In this case, since the metal particle mask was formed in a region for the uneven pattern on the ITO film, the region was selectively etched by dry etching to have a shape corresponding to the shape of the metal particle mask, and the surface of the ITO film was processed in the uneven pattern having a curved surface. The average of the diameters of the bottoms of the convex portions on the uneven surface of the ITO film was about 0.7 μm, and the average of the heights of the convex portions was about 1.0 μm. In addition, the average of the distances between the convex portions was 0.8 μm, and the standard deviation of the value was 50%.

(Formation of Bonding Pad)

Next, the positive electrode bonding pad 17 and the negative electrode bonding pad 18 were formed as follows.

First, a first layer made of Au, a second layer made of Ti, a third layer made of Al, a fourth layer made of Ti, and a fifth layer made of Au were sequentially formed on a portion of the ITO film by a known procedure called lift-off and the same deposition method as described above, thereby forming the five-layer positive electrode bonding pad 17. The thicknesses of the Au, Ti, Al, Ti, and Au layers were 50 nm, 20 nm, 10 nm, 100 nm, and 200 nm, respectively.

Then, the negative electrode bonding pad 18 was formed on the n-type GaN contact layer exposed by the reactive ion etching method by the following processes.

First, a resist was uniformly applied on the entire surface of the exposed region of the n-type GaN contact layer, and the resist was removed from a portion for forming the negative electrode on the exposed n-type GaN contact layer by a known lithography technique. Then, Ti and Au were respectively deposited with thicknesses of 100 nm and 200 nm on the semiconductor by a general vapor deposition method, thereby forming the negative electrode bonding pad 18. Then, the resist was removed by a known method.

Then, the rear surface of the substrate 11 having the positive electrode and the negative electrode formed thereon was ground/polished such that the thickness of the substrate 11 is reduced to 80 μm, and a laser scriber was used to mark the semiconductor. Then, the semiconductor was cut into chips each having a 350 μm square.

(Measurement of Driving Voltage Vf and Emission Power Po)

A probe contacted the chip and a current of 20 mA was applied to the chip to measure a forward voltage (driving voltage: Vf). As a result, the forward voltage was 3.3 V.

In addition, the chip was mounted to a TO-18 package, and the emission power thereof was measured by a tester. When a current of 20 mA was applied, the emission power was 12 mW. It was found that light was emitted from the entire surface of the transparent positive electrode.

(Measurement of Light Distribution)

Light distribution was measured with the chip mounted to the TO-18 package. An LED-100 manufactured by OPTO-SCIENCE INC. was used to measure the light distribution.

First, emission intensity was measured by moving a detector provided above the chip along a track that was arranged at an equal distance from the chip in parallel to one side of the chip. Then, emission intensity was measured by moving the detector along a track that was arranged at an equal distance from the chip in parallel to another side orthogonal to the one side. It was found that the distribution of the emission intensity with respect to an angle between the surface of the substrate and a line linking the detector and the center of the chip was the same at all sides.

Experimental Examples 2 to 10

A gallium nitride based compound semiconductor light-emitting device was manufactured, similar to Experimental example 1, except that the metal particles were made of the material shown in Table 1 and a heat treatment was performed at the temperature shown in Table 1.

Experimental Example 11

A gallium nitride based compound semiconductor light-emitting device was manufactured, similar to Experimental example 1, except that an uneven pattern composed of convex portions was not formed on the surface of the transparent positive electrode (ITO film).

Experimental Examples 12 and 13

A gallium nitride based compound semiconductor light-emitting device was manufactured, similar to Experimental example 1, except that the convex portions were formed on the surface of the transparent positive electrode (ITO film) such that the average distance and the standard deviation have the values shown in Table 1.

Table 1 shows the formation conditions of the uneven patterns according to Experimental examples 1 to 13, the distances between the convex portions, and device characteristics.

the metal particle mask is formed of Ni, and the metal particle mask has a very high melting point of 1455° C. In addition, the heat treatment temperature during the formation of the mask is 600° C. However, the standard deviation of the average distance between the convex portions is 55%.

In the gallium nitride based compound semiconductor light-emitting device according to Experimental example 11 in which an uneven pattern is not formed on the surface of the transparent positive electrode (ITO film), the emission power is 9 mW.

In the gallium nitride based compound semiconductor light-emitting device according to Experimental example 12, the average distance between the convex portions is 1.7 μm, which is a large value, and the emission power is 9 mW.

In the gallium nitride based compound semiconductor light-emitting device according to Experimental example 13, the average distance between the convex portions is 0.8 μm, and the standard deviation of the average distance is 85%, which means a large variation. In addition, the emission power is 9 mW.

The above-mentioned results prove that the gallium nitride based compound semiconductor light-emitting device

TABLE 1

| | Material forming metal particle mask (composition) | Melting point of metal particle mask (° C.) | Heat treatment temperature (° C.) | Average distance between convex portions (μm) | Standard deviation of average distance between convex portions (%) | Average width of bottoms of convex portions (μm) | Driving voltage (Vf) (V) | Emission power (Po) (mW) |
|---|---|---|---|---|---|---|---|---|
| Experimental example 1 | Au/Sn | 278 | 250 | 0.8 | 50 | 0.5 | 3.3 | 12 |
| Experimental example 2 | Ni | 1455 | 600 | 0.4 | 55 | 0.2 | 3.3 | 11 |
| Experimental example 3 | Au/Ge (Ge 14%) | 361 | 450 | 0.5 | 40 | 0.3 | 3.3 | 11 |
| Experimental example 4 | Au/Pb (Pb 84%) | 213 | 220 | 0.8 | 30 | 0.5 | 3.3 | 11 |
| Experimental example 5 | Au/In (In 28%) | 224 | 230 | 0.8 | 30 | 0.6 | 3.3 | 12 |
| Experimental example 6 | Au/Bi (Bi 87%) | 241 | 250 | 0.8 | 20 | 0.5 | 3.3 | 12 |
| Experimental example 7 | Au/Cd (Cd 48%) | 309 | 320 | 0.6 | 15 | 0.4 | 3.3 | 11 |
| Experimental example 8 | Au/Sb (Sb 25%) | 380 | 400 | 0.6 | 30 | 0.4 | 3.3 | 11 |
| Experimental example 9 | Pb/Bi (Bi 55%) | 126 | 150 | 1 | 35 | 0.7 | 3.3 | 11 |
| Experimental example 10 | Pb/Sb (Sb 12%) | 252 | 260 | 0.8 | 45 | 0.6 | 3.3 | 11 |
| Experimental example 11 | No concave and convex portions | — | — | — | — | — | 3.3 | 9 |
| Experimental example 12 | Au/Sn | 278 | 250 | 1.7 | 50 | 0.5 | 3.3 | 9 |
| Experimental example 13 | Au/Sn | 278 | 250 | 0.8 | 85 | 0.5 | 3.3 | 9 |

According to the evaluation result of the device characteristics shown in Table 1, in the gallium nitride based compound semiconductor light-emitting devices according to Experimental examples 1 to 10 in which a random uneven surface is formed on the surface of the transparent positive electrode, the average distance between the convex portions is in the range of 0.05 to 1.5 μm, and the standard deviation of the average distance between the convex portions is in the range of 10 to 80%.

In the gallium nitride based compound semiconductor light-emitting devices according to Experimental examples 1 to 10, the emission power is greater than or equal to 11 mW.

In the gallium nitride based compound semiconductor light-emitting device according to Experimental example 2, according to the invention has high light emission efficiency and high device characteristics.

INDUSTRIAL APPLICABILITY

The invention can be applied to manufacture a gallium nitride based compound semiconductor light-emitting device having high light emission efficiency and a small wavelength variation.

The invention claimed is:

1. A method of manufacturing a gallium nitride based compound semiconductor light-emitting device, the method comprising:

(1) a process of sequentially forming on a substrate an n-type semiconductor layer, a light-emitting layer, and a p-type semiconductor layer, and a transparent positive electrode, the n-type semiconductor layer, the light-emitting layer, and the p-type semiconductor layer each composed of a gallium nitride based compound semiconductor;
(2) a process of forming a mask made of metal particles on the surface of the transparent positive electrode; and
(3) a process of performing dry etching on the transparent positive electrode using the mask,
wherein the metal particles of the mask are made of Ni, or a Ni alloy.

2. The method of manufacturing a gallium nitride based compound semiconductor light-emitting device according to claim 1,
wherein the process (2) includes:
forming a metal thin film on the surface of the transparent positive electrode; and
performing a heat treatment.

3. The method of manufacturing a gallium nitride based compound semiconductor light-emitting device according to claim 1,
wherein an uneven surface is formed on at least a portion of the surface of the transparent positive electrode by wet etching.

4. A lamp comprising the gallium nitride based compound semiconductor light-emitting device manufactured by the method according to claim 1.

* * * * *